United States Patent
Yoo et al.

(10) Patent No.: US 7,512,003 B2
(45) Date of Patent: Mar. 31, 2009

(54) NON-VOLATILE MEMORY DEVICE

(75) Inventors: Hyun-Khe Yoo, Suwon-si (KR); Ji-Do Ryu, Suwon-si (KR); Bo-Young Seo, Anyang-si (KR); Chang-Min Jeon, Seoul (KR); Hee-Seog Jeon, Hwaseong-si (KR); Sung-Gon Choi, Osan-si (KR); Jeong-Uk Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 11/789,003

(22) Filed: Apr. 23, 2007

(65) Prior Publication Data

US 2008/0008003 A1    Jan. 10, 2008

(30) Foreign Application Priority Data

Jul. 4, 2006    (KR) ............... 10-2006-0062626

(51) Int. Cl.
    *G11C 11/34* (2006.01)
(52) U.S. Cl. ................ 365/185.11; 365/185.13
(58) Field of Classification Search ............ 365/185.11, 365/185.13, 185.05, 185.16
See application file for complete search history.

(56) References Cited

U.S. PATENT DOCUMENTS

| | | | |
|---|---|---|---|
| 6,188,605 B1 | 2/2001 | Nomura et al. | |
| 6,256,227 B1 | 7/2001 | Atsumi et al. | |
| 6,333,867 B1 | 12/2001 | Suzuki et al. | |
| 6,760,254 B2* | 7/2004 | Taura .................... | 365/185.11 |
| 7,193,897 B2* | 3/2007 | Lee ........................ | 365/185.17 |
| 7,339,825 B2* | 3/2008 | Iioka et al. ............ | 365/185.13 |

FOREIGN PATENT DOCUMENTS

| | | |
|---|---|---|
| JP | 11-261036 | 9/1999 |
| JP | 2000-068486 | 3/2000 |
| JP | 2001-014876 | 1/2001 |
| KR | 10-0315412 | 9/1999 |
| KR | 20010029835 | 4/2001 |
| KR | 10-0315412 | 11/2001 |

* cited by examiner

*Primary Examiner*—Anh Phung
(74) *Attorney, Agent, or Firm*—Mills & Onello, LLP

(57) ABSTRACT

A non-volatile memory device includes a memory cell block, a first switching block, and a second switching block. A plurality of memory cells are arranged in the memory cell block and each of the memory cells includes a memory transistor having a floating gate and a control gate and is connected to a local bit line and includes a selection transistor connected to the memory transistor in series that is connected to a source line. The first switching block selectively connects a global bit line to the local bit line and the second switching block controls the memory cells in the memory cell block in units of a predetermined number of bits. The first switching block includes at least two switching devices connected in parallel between the global bit line and the local bit line.

11 Claims, 4 Drawing Sheets

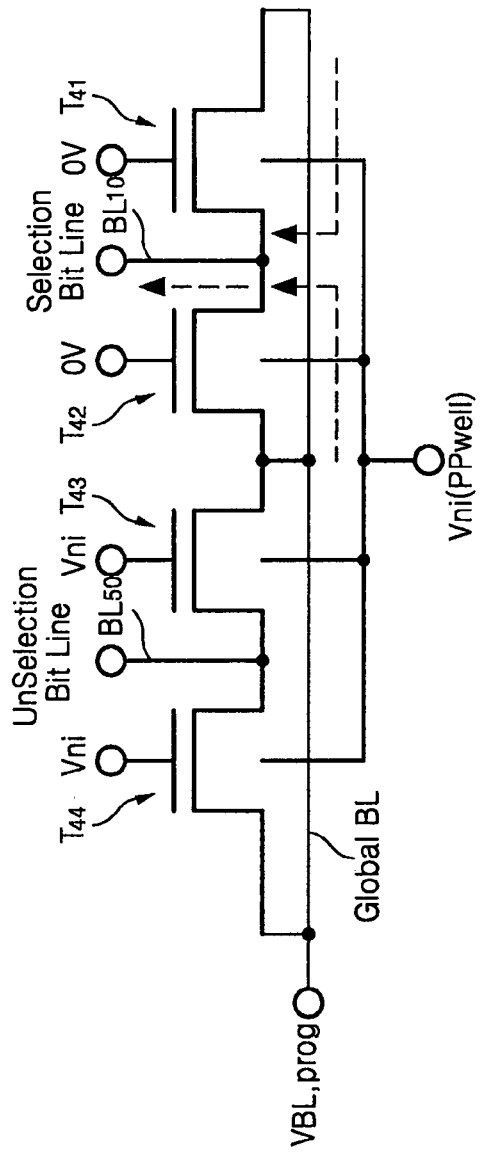
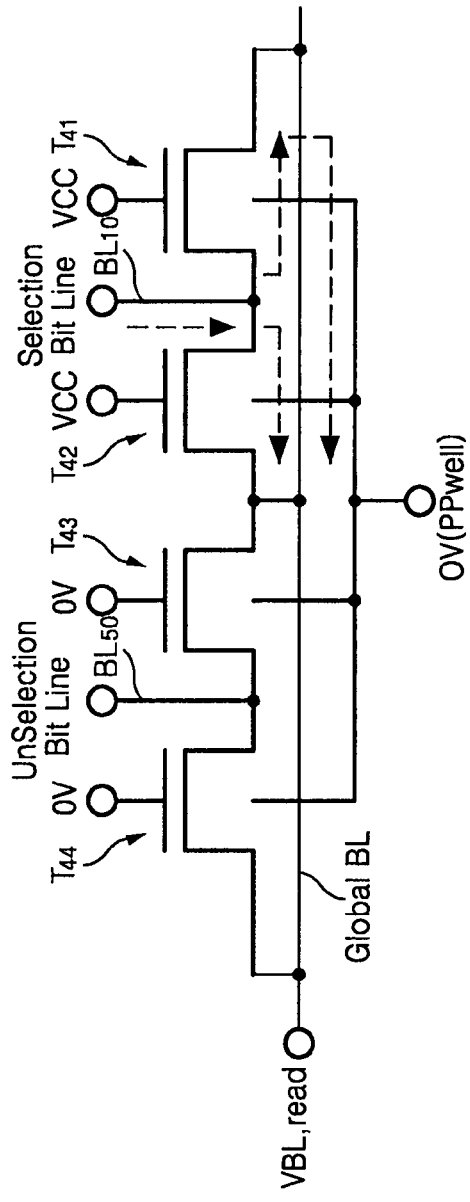

NON-VOLATILE MEMORY DEVICE

CROSS-REFERENCE TO RELATED PATENT APPLICATIONS

This application claims the benefit of priority to Korean Patent Application No. 10-2006-0062626, filed on Jul. 4, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a non-volatile memory device having a 2-T (transistor) FN (fowler-Nordheim) type EEPROM (electrically erasable programmable read-only memory) memory cell.

2. Description of the Related Art

Unlike DRAM or SRAM devices that are erasable when power is not supplied, non-volatile memory devices are not erasable even when the power supply is discontinued. A typical non-volatile memory device is an EEPROM that is electrically programmable and erasable. The EEPROM is used to store permanent codes and is typically programmed in units of bytes and erased in units of blocks or sectors. Recently, flash memories that are erasable in units of bytes have been suggested, where a 2T FN type EEPROM is mainly used for such flash memories.

The 2T FN type EEPROM refers to an EEPROM in which two transistors constitute one memory cell and programming and erasing is performed using an FN tunneling method. The two transistors constituting the memory cell are connected in series, in which one is a FLOTOX (floating gate tunnel oxide) type memory transistor and the other is a selection transistor.

As the memory capacity of the EEPROM device has increased, the size of a unit memory cell has gradually decreased, so that the active width and capacitance of the memory cell has been reduced. As a result, the efficiency in the programming and erasing of the memory cell has been deteriorated. Consequently, as a threshold voltage of an on-cell memory transistor has increased, the affect with respect to the on-cell current has become disadvantageous. The "on-cell," or an "erased cell," means a memory cell in which the threshold voltage is lowered, for example, not greater than +1V, as electrons escape from a floating gate of the memory transistor. In contrast, an "off-cell", or a "programmed cell", is a memory cell in which the threshold voltage is high, for example, not less than +5V, as electrons are accumulated at the floating gate of the memory transistor.

Once the threshold voltage of the on-cell becomes high, the amount of the on-cell current is decreased. In particular, the threshold voltage Vth of the on-cell increases due to the repeated work of storing and deleting data. Accordingly, as the amount of current of the on-cell decreases, it is difficult to determine whether it is the on-cell or the off-cell. When the determination of the on-cell or off-cell becomes difficult, a read error can occur.

To solve the problem, a process improvement has been implemented to improve the quality of a tunnel oxide in which electrons are tunneled. However, this improvement alone has not completely resolved the problem, since various restrictions in view of the process exist.

SUMMARY OF THE INVENTION

In accordance with aspects of the present invention, provided is a non-volatile memory device which improves a current characteristic of an EEPROM memory cell, in particular, an on-cell current characteristic, to make a read speed relatively fast, while also reducing the possibility of a read error.

According to an aspect of the present invention, a non-volatile memory device comprises a memory cell block, a first switching block, and a second switching block. A plurality of memory cells are arranged in the memory cell block and each of the memory cells includes a memory transistor having a floating gate and a control gate and is connected to a local bit line, and a selection transistor connected to the memory transistor in series and is further connected to a source line. The first switching block is configured to selectively connect a global bit line to the local bit line and the second switching block is configured to control the memory cells in the memory cell block in units of a predetermined number of bits. The first switching block includes at least two switching devices connected in parallel between the global bit line and the local bit line.

Each of the switching devices can be an NMOS, PMOS, or CMOS device.

Each of the switching devices can be substantially the same as the selection transistor.

The predetermined number of bits can be eight bits.

The control gate of the memory transistor can be connected to a local sense line and the second switching block can be configured to selectively connect the global sense line to the local sense line.

The memory cell block can comprise EEPROM memory cells.

According to another aspect of the present invention, a non-volatile memory device comprises a plurality of memory sectors including a plurality of memory cells, each of the memory cells having a memory transistor and a selection transistor, a global bit line, a global sense line, a local bit line configured to apply a bit line voltage to one of the memory sectors corresponding to the local bit line, a local sense line configured to connect control gates of the memory transistors in units of a predetermined number of bits, a first switching device configured to selectively connect the global bit line to the local bit line, and a second switching device configured to selectively connect the global sense line to the local sense line. The first switching device includes at least two switching transistors connected in parallel between the global bit line and the local bit line.

Each of the switching transistors can be an NMOS, PMOS, or CMOS device.

Each of the switching transistors can be substantially the same as the selection transistor.

The predetermined number of bits can be eight bits.

The plurality of memory cells can comprise EEPROM memory cells.

BRIEF DESCRIPTION OF THE DRAWINGS

Various aspects of the present invention will become more apparent by describing in detail illustrative embodiments with reference to the attached drawings, in which:

FIGS. 3A and 3B are circuit diagrams for explaining the operation of an embodiment of a sector selection switching device of the memory array of the non-volatile memory device of FIG. 1.

DETAILED DESCRIPTION OF PREFERRED EMBODIMENTS

Figure 1:
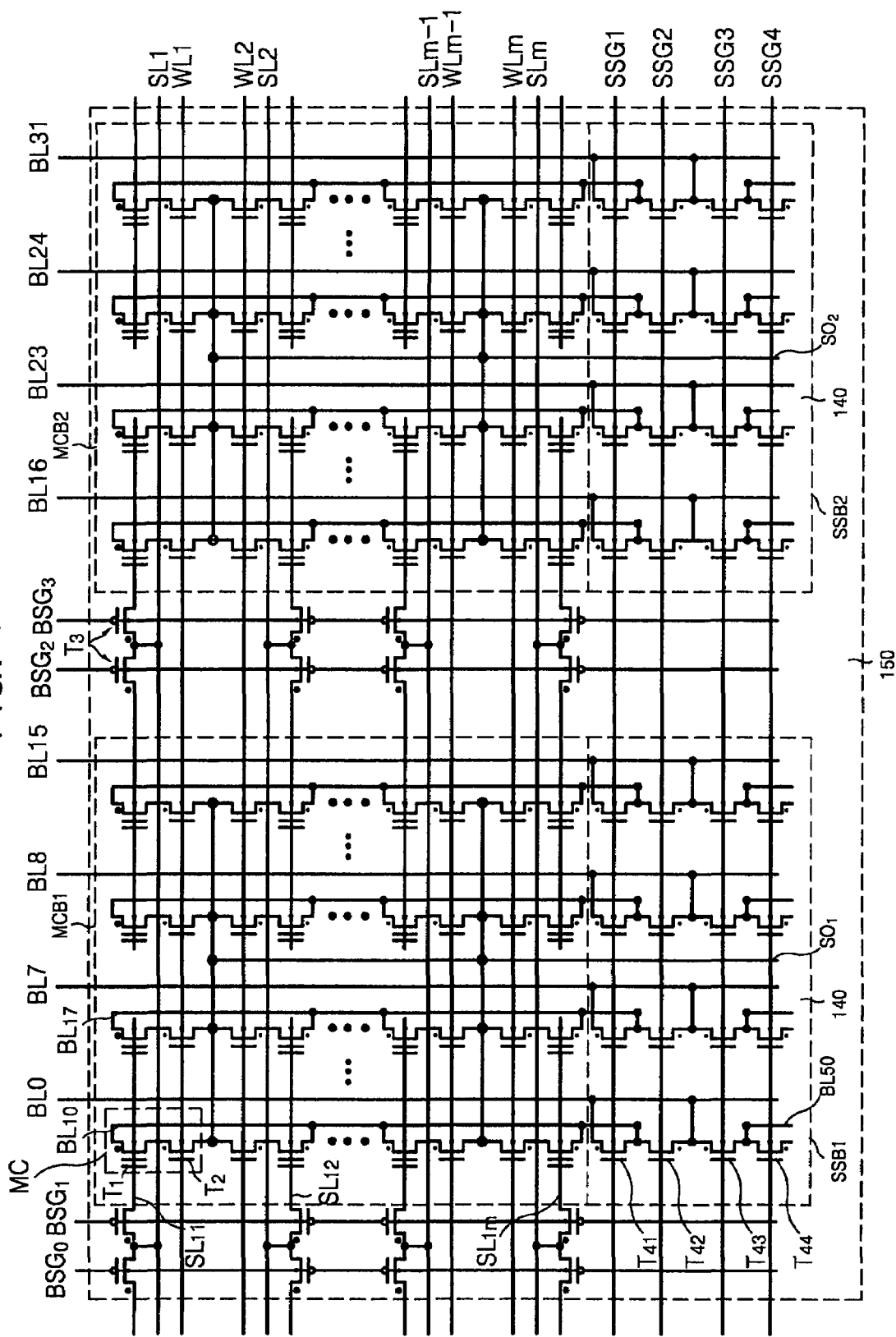
FIG. 1 is a circuit diagram showing an embodiment of a part of a memory array of a non-volatile memory device according to an aspect of the present invention.

Hereinafter, aspects of the present invention will be described or explained with reference to the attached figures. The invention is not limited to or by the illustrative preferred embodiments disclosed herein. Like reference numerals in the figures denote like elements.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements may be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

FIG. 1 is a circuit diagram showing an embodiment of a part of a memory array of a non-volatile memory device according to an aspect of the present invention. Referring to FIG. 1, a non-volatile memory device according to this embodiment includes a plurality of memory cell blocks MCBi, for example, MCB1, MCB2, which are referred to as sectors, a plurality of sector selection switching blocks SSBi, for example, SSB1, SSB2, and a byte selection switching block.

Each of the memory cell blocks MCBi includes a plurality of memory cells MC arranged in rows and columns. Each of the memory cells MC can be formed of two transistors, that is, a memory transistor $T_1$ and a selection transistor $T_2$. The memory transistor $T_1$ stores data at a level of "0" or "1" while the selection transistor $T_2$ selects a memory bit. In this embodiment, the memory transistor $T_1$ is a FLOTOX (floating gate tunnel oxide) type transistor having a floating gate FG and a control gate CG. And the selection transistor $T_2$ includes a selection gate SG. A plurality of the memory cells MC constitutes a memory cell block MCBi, such as MCB1 and MCB2.

The control gates CG of the memory transistors $T_1$ located in the memory cell block MCB1 are connected to a plurality of local sense lines $SL_{in}$, for example, $SL_{11}$, $SL_{12}$, ... $SL_{1m}$, one sense line in each row. The selection gates of the selection transistors $T_2$ are connected to a plurality of word lines WLi, for example, WL1, WL2, WLm, also one word line in each row. Also, the selection transistors $T_2$ are connected to a plurality of common source lines $SO_i$, for example, $SO_1$, $SO_2$. The common source lines $SO_i$ can be configured for each row, each column, each sector, or the entire memory device. In FIG. 1, not all the connections of the common source lines $SO_i$ are illustrated.

The sector selection switching blocks SSBi and the byte selection switching block are located proximate to the memory cell blocks MCBi. The sector selection switching blocks SSBi include a plurality of sector selection switching devices $T_{41}$, $T_{42}$, $T_{43}$, and $T_{44}$. The sector selection switching devices $T_{41}$, $T_{42}$, $T_{43}$, and $T_{44}$ can be embodied in form of a switching transistor at each of a predetermined number, for example, 64, of the memory cells in the column direction.

Each of the sector selection switching devices $T_{41}$, $T_{42}$, $T_{43}$, and $T_{44}$ selectively connects a global bit line BLi, for example, BL0, ... BL7, BL8, to a local bit line BLn, for example, $BL_{10}$, $BL_{17}$, $BL_{50}$, which extends over a single sector, and is controlled by a sector selection gate line SSGi, for example, SSG1, SSG2, SSG3, SSG4, which extend parallel to the word lines WLi. In the present embodiment, at least two sector selection switching transistors are connected in parallel between each global bit line and the local bit line corresponding thereto.

The sector selection switching devices $T_{41}$, $T_{42}$, $T_{43}$, and $T_{44}$ are located in the same conductive region as the memory cell MC. For example, when the memory cell MC is located in a first conductive region 140, the sector selection switching devices $T_{41}$, $T_{42}$, $T_{43}$, and $T_{44}$ are also located in the first conductive region 140. The "first conductive type" and the "second conductive type" refer to conductive types that are opposite to each other, like P-type and N type. The conductive region can be a well or semiconductor substrate. Also, the sector selection switching devices $T_{41}$, $T_{42}$, $T_{43}$, and $T_{44}$ can be, for example, PMOS, NMOS, or CMOS. In the present embodiment, each of the sector selection switching devices $T_{41}$, $T_{42}$, $T_{43}$, and $T_{44}$ is embodied in an N-type transistor. But in other embodiments they could, for example be embodied in P-type transistors.

The byte selection switching block includes a byte selection switching device $T_3$ that selects the memory cell in units of bytes from a selected sector. The byte selection switching device $T_3$ can be embodied in form of a switching transistor for every 1 byte memory cell, as an example.

The byte selection switching device $T_3$ selectively connects a plurality of global sense lines SLi, for example, SL1, SL2, to the local sense lines $SL_{in}$, for example, $SL_{11}$, $SL_{12}$, $SL_{1m}$, and is controlled by the byte selection gate lines $BSG_i$, for example, $BSG_0$, $BSG_1$, $BSG_2$, $BSG_4$, which extend parallel to the bit lines.

The byte selection switching device $T_3$ is located in a different conductive region from the memory cell MC, in this embodiment. For example, when the memory cell MC is located in the first conductive region 140, the byte selection switching device $T_3$ is located in a second conductive region 150. The conductive region can be a well or semiconductor substrate. Also, the byte selection switching device $T_3$ can be, for example, PMOS, NMOS, or CMOS. In the present embodiment, the byte selection switching device $T_3$ is embodied in a P-type transistor.

In the present embodiment, a sector MCBi is comprised of 2 byte memory cells in the row direction and n-number, for example, 64, of the memory cells in the column direction. The sector selection switching blocks SSBi are located at the upper or lower end of each sector MCBi while the byte selection switching device $T_3$ is located at the left or right side of each sector MCBi.

Figure 2:
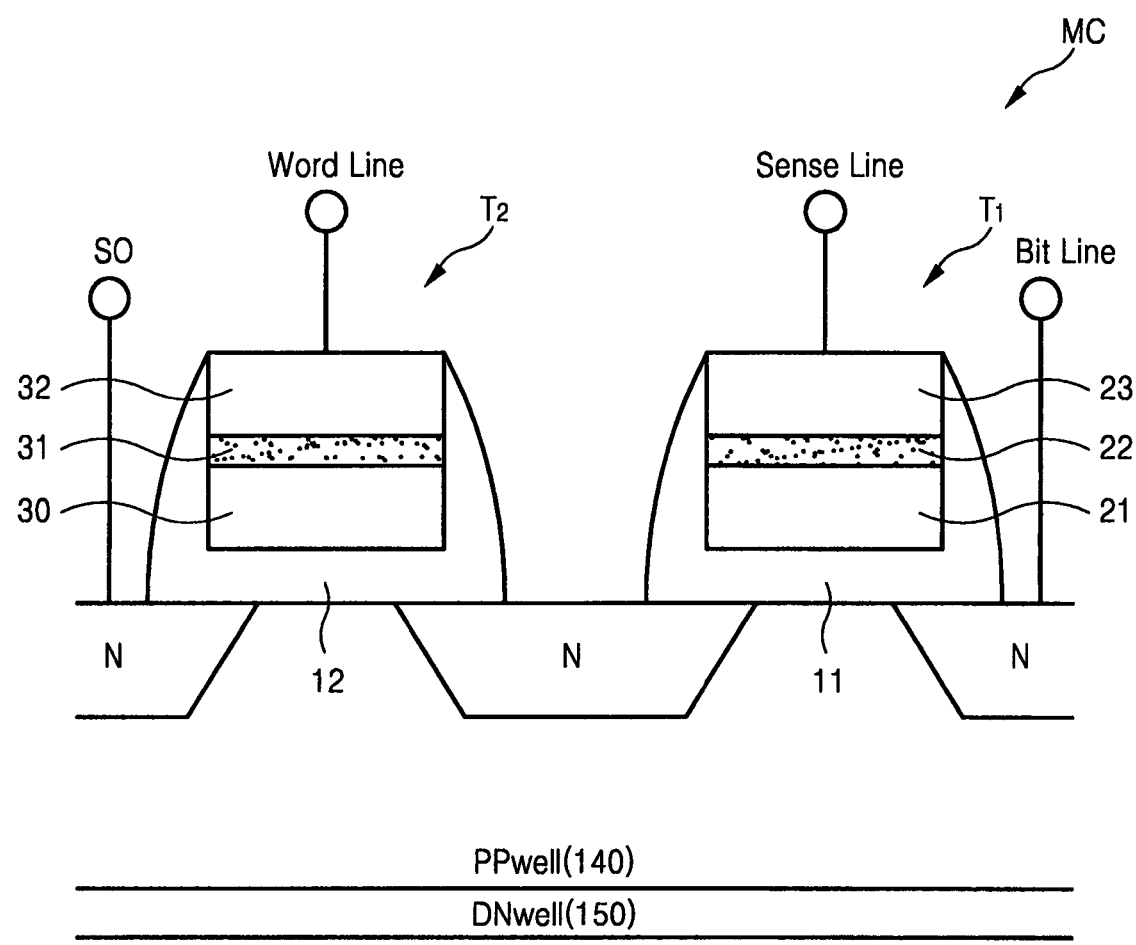
FIG. 2 is a cross-sectional view schematically showing an embodiment of a memory cell of the memory array of the non-volatile memory device of FIG. 1.

FIG. 2 is a cross-sectional view schematically showing an embodiment of a memory cell of the memory array of the non-volatile memory device of FIG. 1. As shown in FIG. 2, the memory cell MC of the non-volatile memory device includes the memory transistor $T_1$ and the selection transistor $T_2$ formed in a pocket P-type well PPwell 140 that is formed in a deep N-type well DNwell 150 in a P-type semiconductor substrate (not shown).

The memory transistor $T_1$ includes a floating gate 21 in the pocket P-type well PPwell, an intergate insulation film 22 on the upper surface of the floating gate 21, and a control gate 23 on the upper surface of the intergate insulation film 22. Also, a gate insulation film 11 is interposed between the pocket P-type well PPwell and the floating gate 21. The gate insulation film 11 includes a tunneling region having a relatively thin thickness. The tunneling region can be formed to have a thickness at which FN tunneling is possible during the programming and erasing of the memory cell MC, methods for determining such a thickness being known in the art. Electric charges move to the floating gate 21 through the tunneling region.

A port of the memory transistor $T_1$, for example, a drain region N, is connected to the corresponding local bit line (e.g., $BL_{10}$). The selection transistor $T_2$ includes a selection gate 30 and can include an insulation film pattern 31 and a pseudo gate 32 similar to the memory transistor $T_1$, in view of the simplification of a process. A port of the selection transistor $T_2$, for example, a source region, is connected to a common source line SO. Also, a gate insulation film 12 is interposed between the pocket P-type well PPwell and the selection gate 30.

As shown in FIG. 2, as the bit line and the memory transistor $T_1$ are located close to each other, the memory transistor $T_1$ can be disturbed by continuous stress from an applied bit line voltage. Accordingly, the on-cell current of the memory transistor $T_1$ can be deteriorated.

As the bit line voltage is applied to only a sector selected using the sector selection switching device, although the disturbance due to the bit line voltage can be reduced, a unit memory cell area is further limited due to the increase of integration and the structure of a sector. Accordingly, the memory transistor $T_1$ must be formed to be appropriate for a cell unit pitch. Thus, the active width of the memory transistor $T_1$ is limited so that the on-cell current is further limited.

To improve the on-cell current, in the present embodiment, the sector selection switching devices $T_{41}$, $T_{42}$, $T_{43}$, and $T_{44}$ are implemented in a parallel structure. The amount of current of the sector selection switching devices $T_{41}$, $T_{42}$, $T_{43}$, and $T_{44}$ can be increased by increasing the active widths of the sector selection switching devices $T_{41}$, $T_{42}$, $T_{43}$, and $T_{44}$. However, since the cell unit pitch in the row direction (that is, word line direction, referred to as "cell X pitch") is smaller than it is in the column direction (that is, the pitch in a bit line direction, referred to as "cell Y pitch"), there is a limit to the amount of increase in the active widths of the sector selection switching devices $T_{41}$, $T_{42}$, $T_{43}$, and $T_{44}$. Also, since the sector selection switching devices $T_{41}$, $T_{42}$, $T_{43}$, and $T_{44}$ can be substantially the same as the selection transistor $T_2$, it is difficult to increase the active width of the sector selection switching devices $T_{41}$, $T_{42}$, $T_{43}$, and $T_{44}$. In spite of the above limitations, the sector selection switching devices $T_{41}$, $T_{42}$, $T_{43}$, and $T_{44}$ can be equipped with a current driving capability over a unit memory cell current, while not working as a bottleneck of the bit line current.

Thus, in accordance with the present embodiment, to improve the current driving capability of the sector selection switching devices $T_{41}$, $T_{42}$, $T_{43}$, and $T_{44}$, as shown in FIG. 1, two switching devices $T_{41}$ and $T_{42}$, and $T_{43}$ and $T_{44}$, are connected in parallel between each global bit line and the local bit line corresponding thereto.

FIGS. 3A and 3B are circuit diagrams for explaining the operation of an embodiment of a sector selection switching device of the memory array of the non-volatile memory device of FIG. 1. Referring to FIG. 3A, the operation of the sector selection switching devices $T_{41}$, $T_{42}$, $T_{43}$, and $T_{44}$ during program (read) will be described.

The two sector selection switching devices $T_{41}$ and $T_{42}$ are connected in parallel between the local bit lines $BL_{in}$, for example, $BL_{10}$, extending over a sector, and the global bit lines BL, for example, BL0, to selectively connect the local bit lines $BL_{in}$ and the global bit lines BLi.

The other two sector selection switching devices $T_{43}$ and $T_{44}$ are connected in parallel between the local bit lines $BL_{in}$, for example, $BL_{50}$, extending over another sector, and the global bit lines BL, for example, BL0, to selectively connect the local bit lines $BL_{in}$ and the global bit lines BLi.

It is assumed that $BL_{10}$ is a selected local bit line and $BL_{50}$ is an unselected local bit line. That is, it is assumed that the first memory block MCB1 is selected and the other memory block, for example, MCB2, is not selected.

In this case, Vni, for example, −7V, is applied to the pocket P-type well PPwell, 0V is applied to the control gates of the sector selection switching device $T_{41}$, and $T_{42}$, and Vni, for example, −7V, is applied to the control gates of the sector selection switching devices $T_{43}$ and $T_{44}$. Accordingly, the sector selection switching devices $T_{43}$ and $T_{44}$ are turned off and the sector selection switching devices $T_{41}$ and $T_{42}$ are turned on so that the global bit line, for example, BL0, and the selected local bit line $BL_{10}$ are electrically connected. That is, the local bit line corresponding to the sector that is selected by the sector selection switching devices $T_{41}$ and $T_{42}$, here the local bit line of the first memory block MCB1, are connected to the corresponding global bit line. In contrast, the local bit line corresponding to the unselected sector, for example, the second memory block MCB2, is not connected to its corresponding global bit line.

Thus, during the programming of the memory cell, a bit line program voltage $V_{BL\_prog}$ is applied from the global bit line to the local bit line selected through the sector selection switching devices $T_{41}$ and $T_{42}$. Thus, during the programming, the current can be provided from the global bit line to the local bit line selected through the two sector selection switching devices $T_{41}$ and $T_{42}$, as indicated by a dashed line in FIG. 3A. Thus, a program speed can be faster, as will be appreciated by those skilled in the art.

The bit line program voltage $V_{BL\_prog}$ is $V_{ni}$ and 0V respectively for the program and program inhibit, as shown in Table 1. The voltage condition for the program of a non-volatile memory device according to the present embodiment is shown in Table 1.

TABLE 1

| | BL | SL | WL | S0 | SSG | BSG | PPwell | DNWELL |
|---|---|---|---|---|---|---|---|---|
| Selection | Vni/0 | Vpp | Vni/0 | Fl | 0 | 0 | Vni | Vpp |
| Non-selection | Fl | 0 | Vnn/0 | Fl | Vni | Vpp | 0 | Vpp |

(where, Vpp: positive high voltage, Vpi: positive intermediate voltage, Vnn: negative high voltage, Vni: negative intermediate voltage, Fl: floating, 0: ground)
Vpp, Vpi, Vnn, and Vni can be, for example, 10 V, 7 V, −10 V, and −7 V, respectively.

Referring to FIG. 3B, an operation of the sector selection switching devices $T_{41}$, $T_{42}$, $T_{43}$, and $T_{44}$ will be described during a reading operation.

The connection relationship among the global bit line BL, for example, BL0, the local bit lines $BL_{10}$, $BL_{50}$, and the sector selection switching devices $T_{41}$, $T_{42}$, $T_{43}$, and $T_{44}$ is the same as that shown in FIG. 3A. However, the voltage condition for the reading of the memory cell is different from the voltage condition for the programming shown in FIG. 3A. The voltage condition for the reading of a non-volatile memory device according to the present embodiment is shown in Table 2.

TABLE 2

| | BL | SL | WL | S0 | SSG | BSG | PPwell | DNWELL |
|---|---|---|---|---|---|---|---|---|
| Selection | Vcc/0 | Vr | Vr | 0 | Vcc | 0 | 0 | Vcc |
| Non-selection | 0 | Vr | 0 | 0 | 0 | Vcc | 0 | Vcc |

(where Vpp: positive high voltage, Vpi: positive intermediate voltage, Vnn: negative high voltage, Vni: negative intermediate voltage, Vr: read voltage, 0: ground)

For illustrative purposes, it is again assumed that $BL_{10}$ is a selected local bit line and $BL_{50}$ is an unselected local bit line. That is, it is assumed that the first memory block MCB1 is selected and the other memory block, for example, MCB2 is not selected.

In this case, 0V is applied to the pocket P-type well PPwell, Vcc is applied to the control gates of the sector selection switching device $T_{41}$ and $T_{42}$, and a bit line read voltage $V_{BL, read}$ is applied to the global bit line. Accordingly, the sector selection switching devices $T_{43}$ and $T_{44}$ are turned off and the sector selection switching devices $T_{41}$ and $T_{42}$ are turned on so that the global bit line and the selected local bit line $BL_{10}$ are connected. The bit line read voltage $V_{BL,read}$ can be set to Vcc, 0, or an appropriate voltage level between 0 and Vcc, for example, 0.5V.

When the selected memory cell is the on-cell, as indicated by a dashed line in FIG. 3B, the on-cell current flows from the selected local bit line $BL_{10}$ to the global bit line BL0 through the two sector selection switching devices $T_{41}$ and $T_{42}$. An effect of increasing the transistor width can be obtained by connecting the two sector selection switching devices $T_{41}$ and $T_{42}$ in parallel between the global bit line and the corresponding local bit line. Thus, the on-cell current flowing through the local bit line is provided to the global bit line without being limited by the sector selection switching devices $T_{41}$ and $T_{42}$ and a sense amplifier (not shown) connected to the global bit line can detect the on-cell current without error. Also, a read speed can be faster, as will be appreciated by those skilled in the art.

Thus, according to the present embodiment, the current driving capability of the sector selection switching devices $T_{41}$, $T_{42}$, $T_{43}$, and $T_{44}$ is improved so that the characteristic of the bit line current, in particular, the on-cell current, can be enhanced.

Figure 4A:
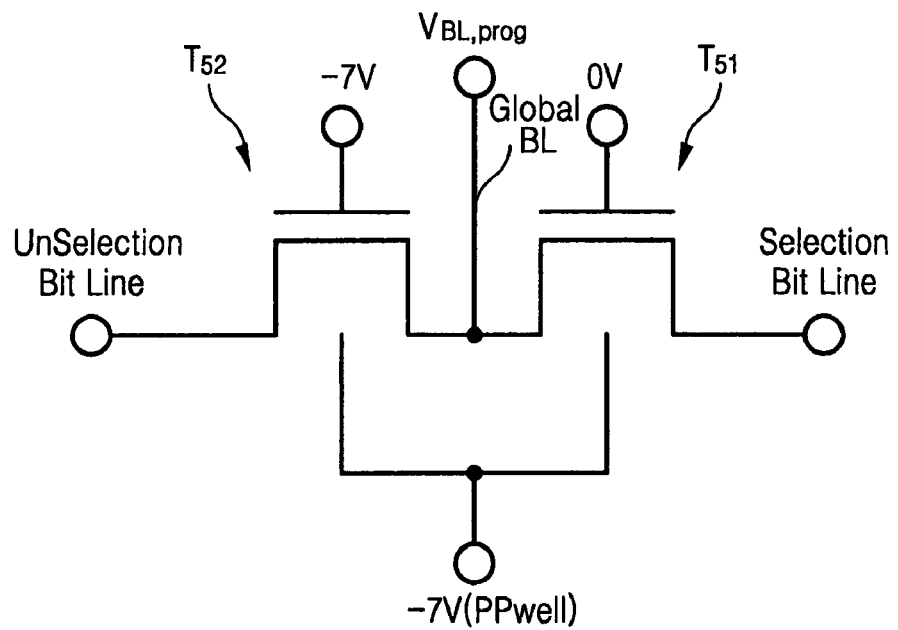
FIGS. 4A and 4B are circuit diagrams for explaining the operation of another embodiment of a sector selection switching device of a non-volatile memory device according to another aspect of the present invention.
Figure 4B:
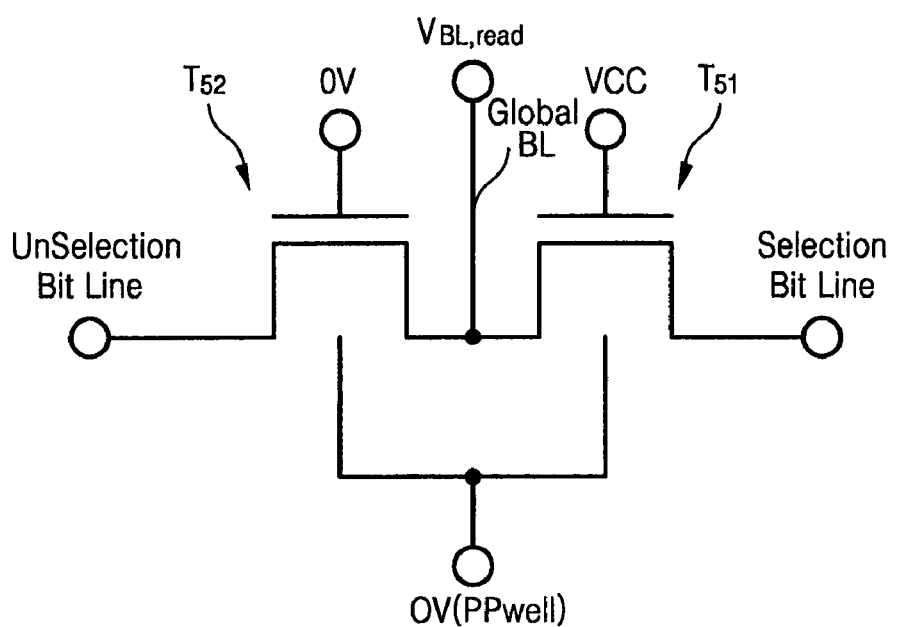

FIGS. 4A and 4B are circuit diagrams for explaining the operation of another embodiment of a sector selection switching device of a non-volatile memory device of according to another aspect of the present invention. Referring to FIG. 4A, the operation of the sector selection switching device during program of a memory device according to the present comparative example will be described below.

In the example shown in FIG. 4A, the global bit line BL can be connected to a corresponding local bit line through a sector selection transistor $T_{51}$, or $T_{52}$. Thus, when the sector selection transistor $T_{51}$, or $T_{52}$ connecting the global bit line and the selected local bit line is turned on, the bit line program voltage $V_{BL,Prog}$ is applied from the global bit line to the selected local bit line through the sector selection transistor. In FIG. 4A the local bit line corresponding to sector selection transistor $T_{51}$ has been selected, so $T_{51}$ is turned on and its local bit line is shown as "Selection Bit Line." Accordingly, the local bit line associated with sector selection transistor $T_{52}$ has not been selected, so $T_{52}$ is turned off and its local bit line is shown as "UnSelection Bit Line."

Referring to FIG. 4B, Vcc is applied to the control gate of the sector selection switching device $T_{51}$ connected to the selected local bit line and 0V is applied to the control gate of the sector selection switching device $T_{52}$ connected to the unselected local bit line. As the sector selection switching device $T_{51}$ having the control gate to which Vcc is applied is turned on, the global bit line BL and the selected local bit line are connected to each other.

When the selected memory cell is the on-cell, the on-cell current flows from the selected local bit line to the global bit line BL through the sector selection switching device $T_{51}$. In the prior art approach, the sector selection switching device worked as a bottleneck, limiting the cell current, since the sector selection switching device took the form of a transistor having active width that was limited to fit to the cell unit pitch.

In contrast, in accordance with aspects of the present invention, despite such limitations of the active width of a transistor used as a sector selection switching device, two or more sector selection switching devices are provided in parallel between the two local lines to be selectively connected to the global bit line, thus the current driving capability of the sector selection switching device is improved, avoiding the bottleneck of the prior art approach. Accordingly, the on-cell current characteristic is improved.

As described above, according to the present invention, the current characteristic, in particular, the on-cell current characteristic, of the EEPROM memory cell is improved. Accordingly, the read speed is made faster and the determination of the on-cell/off-cell is made easy so that a possibility of error in reading is reduced.

While this invention has been particularly shown and described with reference to preferred embodiments, it will be understood by those skilled in the art that various changes in form and details can be made therein without departing from the spirit and scope of the invention as defined by the appended claims. It is intended by the following claims to claim that which is literally described and all equivalents thereto, including all modifications and variations that fall within the scope of each claim.

What is claimed is:

1. A non-volatile memory device comprising:
   a memory cell block in which a plurality of memory cells are arranged, each of the memory cells including:

a memory transistor having a floating gate and a control gate and is connected to a local bit line, and
a selection transistor connected to the memory transistor in series and is further connected to a source line;
a first switching block configured to selectively connect a global bit line to the local bit line; and
a second switching block configured to control the memory cells in the memory cell block in units of a predetermined number of bits,
wherein the first switching block includes at least two switching devices connected in parallel between the global bit line and the local bit line.

2. The non-volatile memory device of claim 1, wherein each of the switching devices is an NMOS, PMOS, or CMOS device.

3. The non-volatile memory device of claim 1, wherein each of the switching devices is substantially the same as the selection transistor.

4. The non-volatile memory device of claim 1, wherein the predetermined number of bits is eight bits.

5. The non-volatile memory device of claim 1, wherein the control gate of the memory transistor is connected to a local sense line and the second switching block selectively connects a global sense line to the local sense line.

6. The non-volatile memory device of claim 1, wherein the memory cell block comprises EEPROM memory cells.

7. A non-volatile memory device comprising:
a plurality of memory sectors including a plurality of memory cells, each of the memory cells having a memory transistor and a selection transistor;
a global bit line;
a global sense line;
a local bit line configured to apply a bit line voltage to one of the memory sectors corresponding to the local bit line;
a local sense line configured to connect control gates of the memory transistors in units of a predetermined number of bits;
a first switching device configured to selectively connect the global bit line to the local bit line; and
a second switching device configured to selectively connect the global sense line to the local sense line,
wherein the first switching device includes at least two switching transistors connected in parallel between the global bit line and the local bit line.

8. The non-volatile memory device of claim 7, wherein each of the switching transistors is an NMOS, PMOS, or CMOS device.

9. The non-volatile memory device of claim 7, wherein each of the switching transistors is substantially the same as the selection transistor.

10. The non-volatile memory device of claim 7, wherein the predetermined number of bits is eight bits.

11. The non-volatile memory device of claim 7, wherein the plurality of memory cells comprises EEPROM memory cells.

* * * * *